(12) United States Patent
Kanazashi

(10) Patent No.: US 6,434,058 B2
(45) Date of Patent: Aug. 13, 2002

(54) SEMICONDUCTOR INTEGRATED CIRCUIT

(75) Inventor: Kazuyuki Kanazashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/817,179

(22) Filed: Mar. 27, 2001

(30) Foreign Application Priority Data

Mar. 28, 2000 (JP) ..................................... 2000-088390

(51) Int. Cl.[7] ............................................... G11C 7/00
(52) U.S. Cl. ............................ 365/189.05; 365/189.07; 365/233
(58) Field of Search ..................... 365/189.01, 189.05, 365/189.07, 194, 222, 230.03, 230.08, 233

(56) References Cited

U.S. PATENT DOCUMENTS 6,084,818 A * 7/2000 Ooishi ................... 365/230.03
6,252,804 B1 * 6/2001 Tomita ................... 365/189.05
6,272,066 B1 * 8/2001 Ooishi ........................ 365/233

* cited by examiner

Primary Examiner—Trong Phan
(74) Attorney, Agent, or Firm—Arent Fox Kintner Plotkin & Kahn, PLLC

(57) ABSTRACT

The address holding part holds a write address supplied corresponding to a write command, as a held write address. The data holding part writes a held write data to a memory cell corresponding to the held write address when receiving the next write command. The address comparison part has a plurality of address comparators that compare a read address, with a held write address, by a plurality of bits. When the results of comparison of the address comparison part are coincident in a read operation, the held write data are outputted as read data. Since the read address and the held write address are compared by a plurality of address comparators, the scale of circuits in the address comparison part can be reduced. Moreover, the addresses can be compared at a high rate, so that the read operation can be performed at a high rate.

4 Claims, 8 Drawing Sheets

SEMICONDUCTOR INTEGRATED CIRCUIT

BACKGROUND OF THE INVENTION

1. Field of the Invention

The present invention relates to a semiconductor integrated circuit having memory cells, and in particular, a semiconductor integrated circuit having a delayed write function.

2. Description of the Related Art

Semiconductor integrated circuits are in the process of becoming faster and faster in line with the development of semiconductor manufacturing technology. Particularly, the operating frequency of a microcomputer, etc., has been improved year by year, wherein a difference between the operating frequency thereof and that of a semiconductor memory such as DRAMs, etc., has become remarkable. In order to reduce the difference, a high-rate memory such as SDRAMs (synchronous DRAMS), etc., has been developed.

Further, recently, in order to improve the using rate of a data bus, an SDRAM has been developed, which has a so-called "delayed write" (or "late write") function by which write data provided with respect to a write command are written in a memory cell when providing a next write command.

FIG. 1 shows an example that performs a write operation during read operations in an SDRAM having this type of delayed write function. In this example, the read latency that is the number of clock cycles from acceptance of a read command to output of the read data is set to "2". Also, the write latency that is the number of clock cycles from acceptance of a write command to acceptance of write data is set to "2".

First, read commands RD0 and RD1 are provided sequentially in synchronization with a clock signal CLK, and a memory core unit operates (FIG. 1(a)). Although not particularly illustrated, a read address is supplied along with the read command. The memory core outputs read data with a delay of approximately 1 clock from the acceptance of the read command. After that, an input/output circuit operates (FIG. 1(b)).

Read data Q00, Q01, Q10, and Q11 are outputted sequentially with a delay of two clocks from the acceptance of the respective read commands RD0 and RD1 as a data signal DQ. The read data Q00 and Q01 or Q10 and Q11 are generated by converting parallel read data, which are transmitted through the interior of the chip to serial read data.

A write command WR0 is provided after two clocks from the acceptance of the read command RD1. In this example, since the write latency is "2", write data DA0 and DA1 are provided with a delay of two clocks from the write command WR0. That is, the write data DA0 and DA1 are provided in synchronization with the clock signal after the read data Q11 is outputted (FIG. 1(c)). At this time, the write data DA0 and DA1 are not written in the memory cells, but are held in a register (FIG. 1(d)).

After that, the read commands RD2, RD3 and RD4 are provided sequentially in synchronization with the next clock signal of the write command WR0, and a read operation is performed at the same timing as described above (FIG. 1(e)). Since the memory core unit does not perform any write operation, it can instantaneously perform the read operation. Therefore, in a SDRAM having a delayed write function, the period in which no data signal DQ is transmitted is minimized, and the using rate of the data bus can be improved.

A next write command WR1 is provided after two clocks from the acceptance of a read command RD4 (FIG. 1(f)). The input/output circuit and the memory core unit operate in synchronization with the acceptance of the write command WR1, and the previous write data DA0 and DA1 that are held in the register are written in the memory cells (FIG. 1(g)).

Next, write data DA2 and DA3 are provided with a delay of two clocks from the write command WR1. The contents of the register are re-written to the write data DA2 and DA3 (FIG. 1(h)).

Thus, in the SDRAM having a delayed write function, it is possible to perform a write operation in the memory cells separately from the intake timing of the write data. At this time, it is possible to prevent the operation of the memory core unit corresponding to the write command from overlapping the operation of the memory core unit corresponding to the read command that is provided immediately after the write command. As a result, the using rate of the data bus can be improved compared with conventional SDRAMs, wherein a large amount of data can be transferred.

However, the SDRAM having a delayed write function is a technology that has been recently proposed, wherein there are some items to be taken into consideration for the commercial use thereof.

For example, where the read address corresponding to the above-described read command RD2 is the same as the write address corresponding to the write command WR0, the SDRAM must output the write data, which are held in the register, as the read data. However, in the SDRAM having a delayed write function, detailed circuits to achieve the function are not taken into consideration.

SUMMARY OF THE INVENTION

It is therefore an object of the invention to provide a semiconductor integrated circuit having a delayed write function that performs the read operation without fail.

According to one of the aspects of a semiconductor integrated circuit of the present invention, the semiconductor integrated circuit includes a memory cell, an address holding part, a data holding part, an address comparison part, and a data selecting part. The address holding part holds a write address which is supplied corresponding to a write command, as a held write address. The data holding part holds write data provided corresponding to the write command as held write data, and writes the held write data held corresponding to the previous write command, to a memory cell corresponding to the held write address when receiving the next write command. The address comparison part has a plurality of address comparators that compare a read address, which is supplied corresponding to a read command, with a held write address, by a plurality of bits. When the result of comparison of the address comparison part is coincident, or in agreement in a read operation, the held write data are outputted as read data. When the results of comparison of the address comparison part are not coincident, data from the memory cell are outputted as read data.

Since the read address and the held write address are compared by a plurality of address comparators, the scale of circuits in the address comparison part can be reduced. In addition, the address comparison can be performed at a high rate, so that the read operation can be performed at a high rate.

According to another aspect of a semiconductor integrated circuit of the invention, the address comparison part includes address comparators each corresponding to a row address and a column address. The row address and the column address are transmitted at almost the same timing, taking just about the same path, respectively. Therefore, by dividing the read address and held write address to a row address and a column address, and comparing them in different address comparators, the addresses can be efficiently compared. That is, address comparison is performed at a high rate.

According to still another aspect of a semiconductor integrated circuit of the invention, a predetermined address comparator operates in response to when comparison made by another address comparator results in a coincidence. For example, a part of the read address and a part of the held write address which are transmitted through the chip earlier, are compared by an predetermined address comparator. Another part of the read address and another part of the held write address which are transmitted through the chip later, are compared by another address comparator when the results of comparison by the predetermined address comparator are coincident. When the results of comparison by the predetermined address comparator are not coincident, the other address comparator does not operate. As a result, the power consumption can be reduced.

According to yet another aspect of a semiconductor integrated circuit of the invention, the semiconductor integrated circuit includes address comparators each corresponding to a row address and a column address. Parts of the row address and the column address are supplied sequentially through the same address terminal. And, the address comparator corresponding to the column address operates according to the result of comparison the address comparator corresponding to the row address. Therefore, the comparison of the row address is enabled before the column address is supplied, so that the read address and the held write address are compared at a high rate.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be explained in detail with reference to the accompanying drawings.

Figure 1:
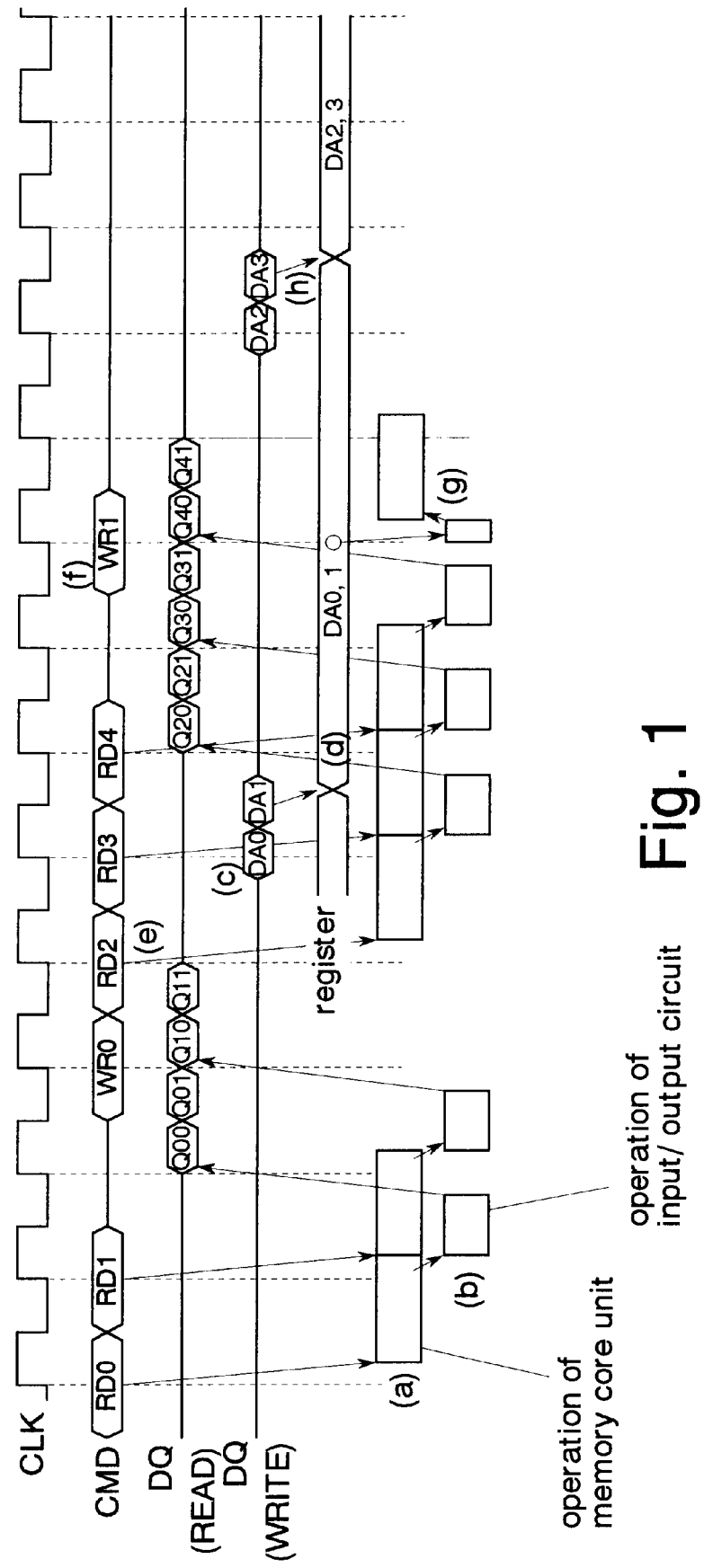
FIG. 1 is a timing chart showing the operation of conventional SDRAMs having a delayed write function.
Figure 2:
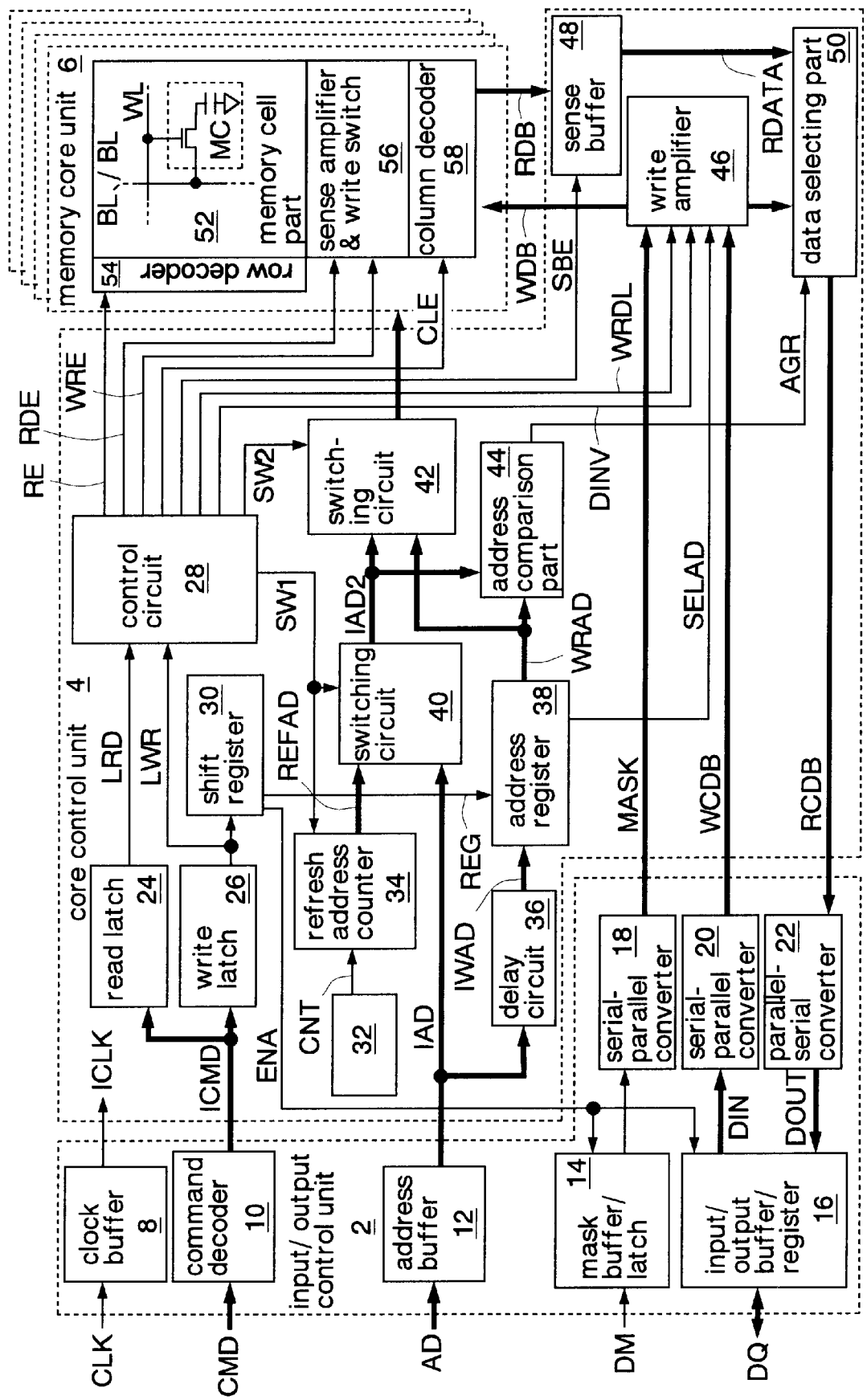
FIG. 2 is a block diagram showing a first embodiment of a semiconductor integrated circuit according to the invention.

FIG. 2 shows the first embodiment of a semiconductor integrated circuit according to the invention.

The semiconductor integrated circuit according to the embodiment is formed as a DDR SDRAM (Double Data Rate SDRAM, hereinafter called a "SDRAM") having a delayed write function on a silicon substrate by using a CMOS process. The DDR SDRAM is a memory that inputs and outputs data in synchronization with both the rise and fall of a clock signal.

The SDRAM includes an input/output control unit 2, a core control unit 4, and a memory core unit 6. In the embodiment, the memory core unit 6 is composed of four blocks. In the drawing, a signal line shown by a broad line shows that it is composed of a plurality of lines.

The input/output control unit 2 includes a clock buffer 8, a command decoder 10, an address buffer 12, a mask buffer/latch 14, an input/output buffer/register 16, serial-parallel converters 18 and 20, and a parallel-serial converter 22.

The clock buffer 8 receives a clock signal CLK from the exterior and outputs the received clock signal to an predetermined internal circuit as an internal clock signal ICLK. The command decoder 10 receives a command signal CMD from the exterior, decodes the received command and outputs it as an internal command signal ICMD. The address buffer 12 receives address signal AD (row address and column address) from the exterior and outputs the received signals as internal address signals IAD. Also, since the SDRAM does not employ an address multiplexing system, the row address and the column address are supplied at the same time.

The mask buffer/latch 14 accepts a data mask signal DM when an enable signal ENA is activated, and outputs the accepted signal to the serial-parallel converter 18. The data mask signal DM is a signal that masks a write operation of predetermined bits of write data.

The input/output buffer/register 16 receives an output data signal DOUT when performing a read operation, and outputs the received signal as a data signal DQ. In addition, the input/output data buffer/register 16 accepts a data signal DQ when the enable signal ENA is activated when performing a write operation, and outputs the accepted signal as an input data signal DIN.

The serial-parallel converter 18 converts the serial data mask signals DM, which is supplied from the mask buffer/latch 14, to a parallel signal, and outputs it as an internal mask signal MASK. The serial-parallel converter 20 receives the serial input data signals DIN, which are supplied from the input/output buffer/register 16, sequentially, converts the received signals to parallel signals, and outputs them as write data signal WCDB. The parallel-serial converter 22 converts parallel read data signals RCDB, which are supplied from a data selecting part 50 as described above, to serial data signals, and outputs them sequentially as output data signals DOUT.

The core control unit 4 includes a read latch 24, a write latch 26, a control circuit 28, a shift register 30, an oscillator 32, a refresh address counter 34, a delay circuit 36, an address register 38, switching circuits 40 and 42, an address comparison part 44, a write amplifier 46, a sense buffer 48 and a data selecting part 50.

The read latch 24 and the write latch 26, respectively, latch an predetermined internal command signal ICMD, and output the latched signal as a latched read signal LRD and a latched write signal LWR.

The control circuit 28 receives the latched read signal LRD and the latched write signal LWR, and outputs a row enable signal RE, a read enable signal RDE, a write enable signal WRE, a column enable signal CLE, a sense buffer enable signal SBE, a write data latch signal WRDL, a data invalid signal DINV, and switch control signals SW1 and SW2. The row enable signal RE is a timing signal for activating a row decoder 54(described later). The read enable signal RDE and the write enable signal WRE are timing signals that are activated in read and write operations. The data invalid signal DINV is a signal that shows that the write data held in a write amplifier 46 (described later) are invalid. The data invalid signal DINV is activated, for example, until a write operation is performed after the power is turned on. The switch control signal SW1 is a signal that shows a refresh cycle. The switch control signal SW2 is a signal that shows either of the read cycle or the write cycle.

The shift register 30 receives the latched write signal LWR and the internal clock signal ICLK, and outputs a register control signal REG and the enable signal ENA. The register control signal REG and the enable signal ENA are outputted in the write operation.

The oscillator 32 generates a count signal CNT for counting up the refresh address counter 34. The refresh address counter 34 generates a refresh address signal REFAD in response to receiving the count signal CNT, and outputs the refresh address signal REFAD in response to the switch control signal SW1.

The delay circuit 36 delays the internal address signal IAD by an predetermined time in compliance with the parallel conversion timing of the write data signal WCDB, and outputs the delayed signal as an internal write address signal IWAD0.

The address register 38 accepts the internal write address signal IWAD0 in synchronization with the register control signal REG that is activated in the write operation, and output the accepted signal as a held write address WRAD. That is, the address register 38 functions as an address holding part. Also, the address register 38 outputs a selected address signal SELAD to the write amplifier 46. The selected address signal SELAD is a signal that transmits, to the write amplifier 46, which address the write data signals WCDB parallel-converted by the serial-parallel converter 20 corresponds to.

The switching circuit 40 selects either the internal address signal IAD or refresh address signal REFAD according to the switch control signal SW1, and outputs the selected signal as an internal address signal IAD2.

The switching circuit 42 selects either the address signal IAD2 or held write address WRAD according to the switch control signal SW2, and outputs the selected signal to the memory core unit 6. The switching circuit 42 selects the internal address signal IAD2 in the read operation and selects the held write address WRAD in the write operation.

The address comparison part 44 compares the internal address signal IAD2 with the held write address WRAD in the read operation, and when signals are coincident, or in agreement, it outputs a agreement signal AGR.

The write amplifier 46 accepts the write data signal WCDB in synchronization with the write data latch signal WRDL, and outputs the previous write data signal WCDB, which has been accepted in synchronization with the previous write data latch signal WRDL, to the memory core unit 6 and the data selecting part 50 as a write data signal WDB. That is, the write amplifier 46 functions as a data holding part. At this time, predetermined bits of the write data signal WCDB are masked by the internal mask signal MASK. In addition, the write amplifier 46 outputs invalid information to the data selecting part 50 instead of the write data signal WDB when the data invalid signal DINV is activated.

The sense buffer 48 receives a read data signal RDB from the memory core unit 6 and outputs the received signal as a read data signal RDATA in synchronization with the sense buffer enable signal SBE.

The data selecting part 50 outputs the write data signal WDB, which is held by the write amplifier 46 when the agreement signal AGR is activated, as the read data signal RCDB, and outputs the read data RDATA, which is from the sense buffer 48 when the agreement signal AGR is inactivated, as the read data signal RCDB.

The memory core unit 6 includes a memory cell part 52 having a plurality of memory cells MC, a row decoder 54, a sense amplifier/write switch 56, and a column decoder 58.

The row decoder 54 receives a pre-decoded signal that is generated in response to the row enable signal REN and internal address signal IAD, and activates a word line WL connected to the memory cells MC. The column decoder 58 receives a pre-decoded signal that is generated in response to the column enable signal CLE and internal address signal IAD and controls the column switch (not illustrated) that is connected to bit lines BL and /BL. The sense amplifier/write switch 56 amplifies data, which are transmitted from the memory cells MC via the bit lines BL and /BL in synchronization with the read enable signal RDE when performing a read operation, and amplifies the write data signal WDB, which is supplied from the exterior in synchronization with the write enable signal WRE when performing a write operation.

Figure 3:
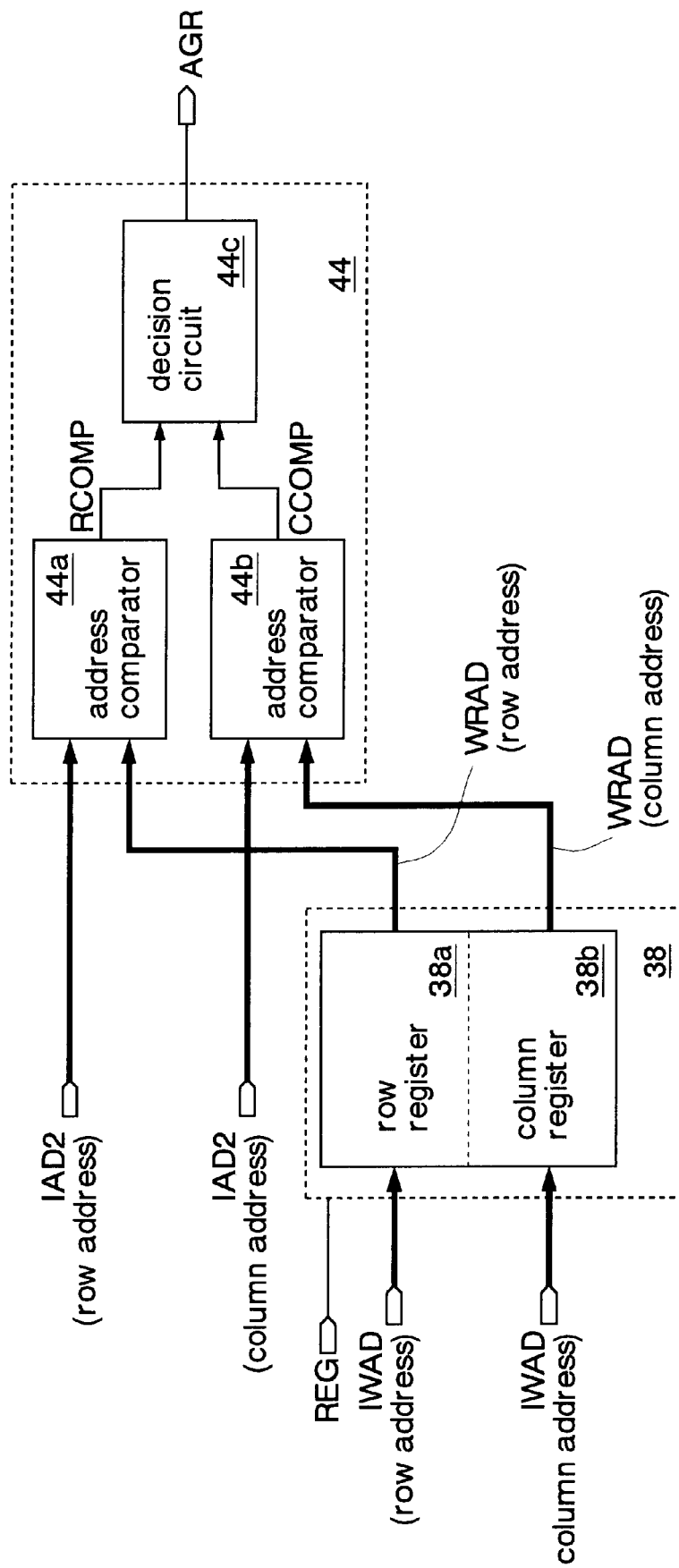
FIG. 3 is a block diagram showing the detail of an address register shown in FIG. 2 and an address comparison part.

FIG. 3 shows the detail of the address register 38 and address comparison part 44.

The address register 38 includes a row register 38a, which holds the row address, of the internal write address signal IWAD, and a column register 38b, which holds the column address, of the internal write address signal IWAD.

The address comparison part 44 includes two address comparators 44a and 44b, and a decision circuit 44c. The address comparators 44a and 44b are formed of an EOR circuit, etc. The decision circuit 44c is formed of an NOR circuit, etc. The address comparator 44a compares the row address of the internal address signal IAD2 with the row address supplied from the address register 38, and outputs a low-leveled comparison result signal RCOMP where both the addresses are made coincident. The address comparator 44b compares a column address of the internal address signal IAD2 with the column address supplied from the address register 38, and outputs a low-leveled comparison result signal CCOMP where both the addresses are coincident. For example, the address comparator 44a compares 12 bits of row addresses while the address comparator 44b compares 9 bits of column addresses. The decision circuit 44c outputs a high-leveled agreement signal AGR when it receives low-leveled comparison result signals RCOMP and CCOMP. That is, in the read operation, where the address signal AD supplied from the exterior is made to agree with the held write address WRAD that is held by the address register 38, the agreement signal AGR is activated.

Figure 4:
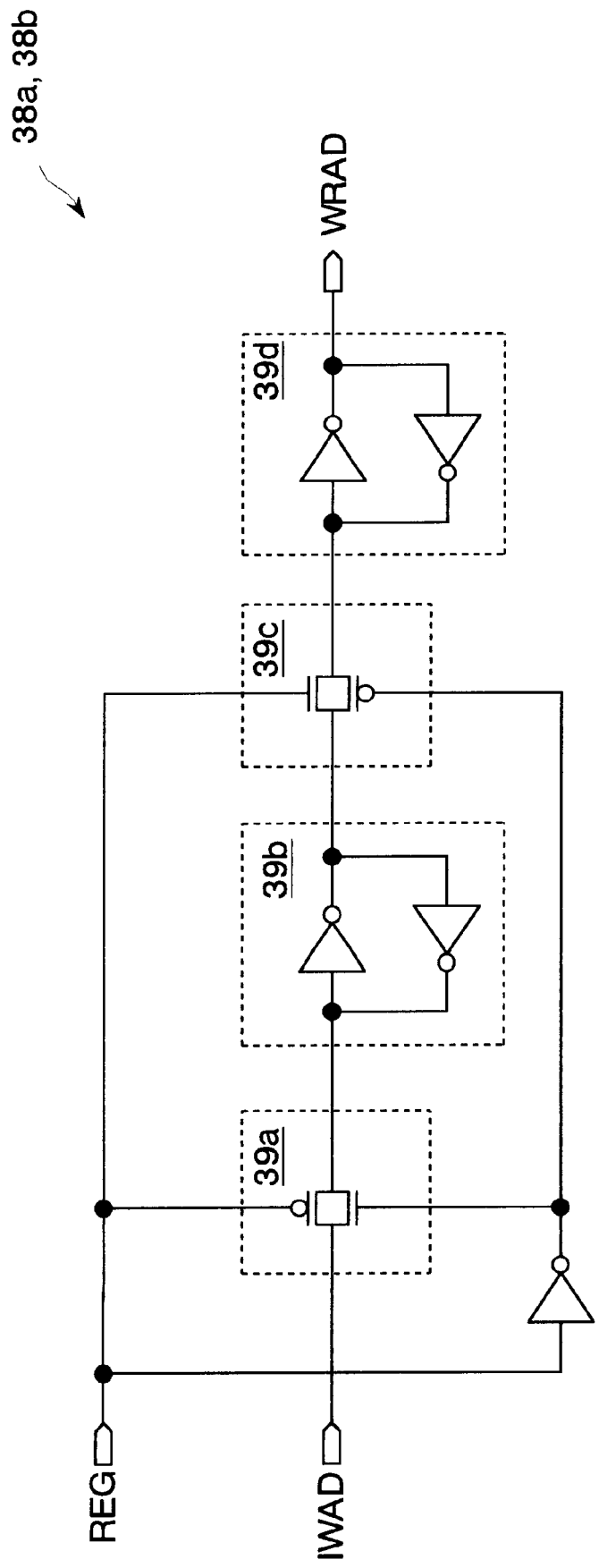
FIG. 4 is a circuit diagram showing the detail of the address register shown in FIG. 3.

FIG. 4 shows the detail of the row register 38a and the column register 38b in the address register 38.

Respective bits of the row register 38a and column register 38b are constructed so that a CMOS transmission gate 39a, a first latch 39b, a CMOS transmission gate 39c, and a second latch 39d are connected to each other in series. The CMOS transmission gate 39a is turned on when the register control signal REG is at a low level, and the CMOS transmission gate 39c is turned on when the register control signal REG is at a high level. The first latch 39b and second latch 39d are formed so that the input and output of two inverters are connected to each other.

In a period for which no write operation is performed (when the register control signal REG is at a low level), the first latch 39b holds an address in response to a change in the internal write address signal IWAD (row address or column address). At this time, since the CMOS transmission gate 39c is turned off, the second latch 39d holds the previous latched address.

As a write operation is performed and the register control signal REG is changed to a high level, the CMOS transmission gate 39a is turned off, and the CMOS transmission gate 39c is turned on. Therefore, at the moment when the register control signal REG is changed to the high level, the address that is held by the first latch 39b is transferred to the second latch 39d. The transferred address is outputted as the held write address WRAD.

After the write operation is completed, the register control signal REG is changed to a low level. The CMOS transmission gate 39b is turned on, and the CMOS transmission gate 39d is turned off. Therefore, the first latch 39a commences to accept a new address in a state where an address is held by the second latch 39b.

Figure 5:
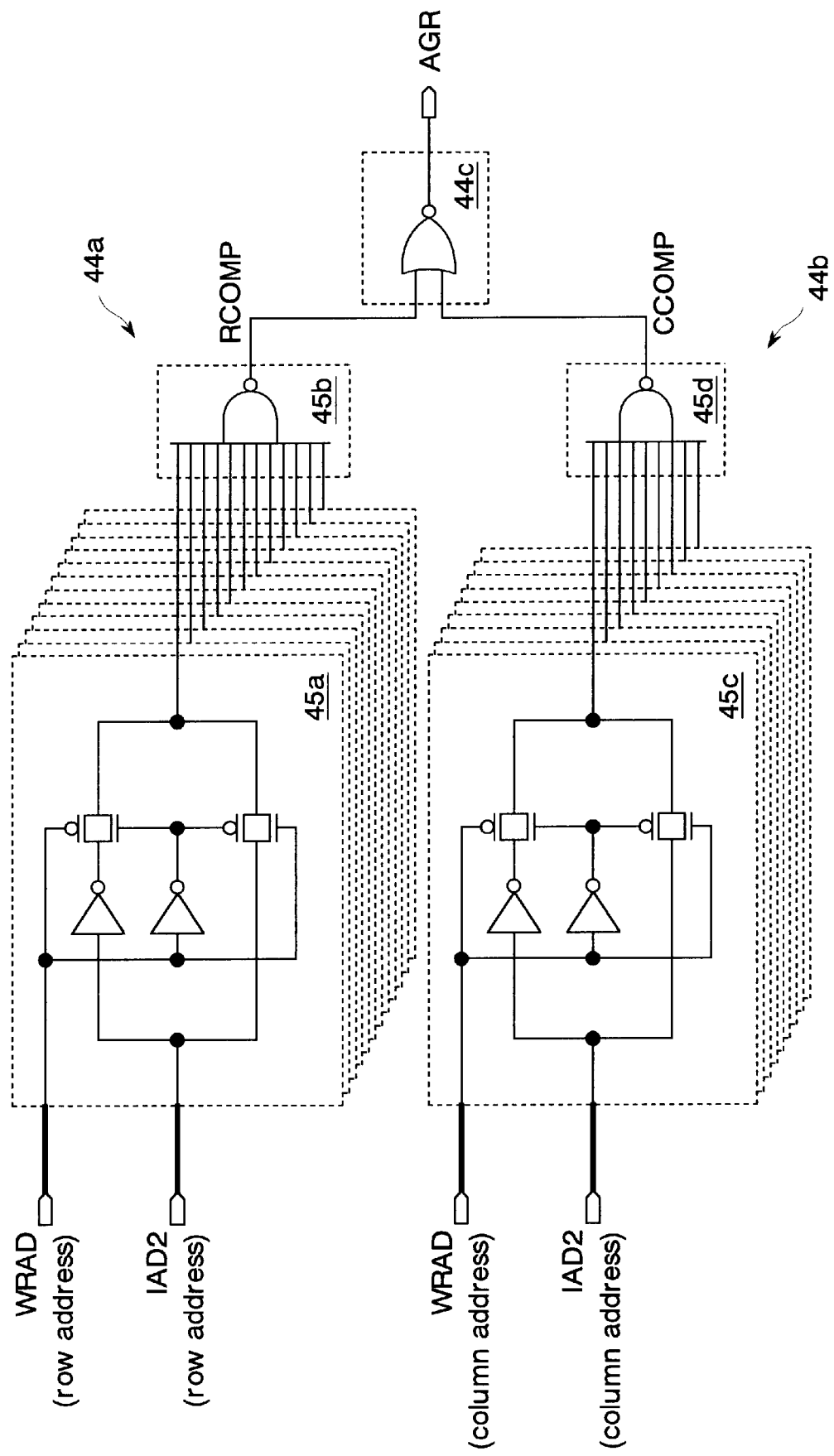
FIG. 5 is a circuit diagram showing the detail of the address comparison part shown in FIG. 3.

FIG. 5 shows the detail of the address comparison part 44.

The address comparator 44a corresponding to the row address includes twelve ENOR circuits 45a (a single bit agreement detector), and an NAND gate 45b (all-bit agreement detector) having twelve inputs, which receives the outputs of the ENOR circuits 45a and outputs a comparison result signal RCOMP. That is, the address comparator 44a operates as an EOR circuit, and where the 12-bit held write address WRAD are equal to the 12-bit internal address signal IAD2 in all the bits, a low-leveled comparison result signal RCOMP is outputted.

The address comparator 44b corresponding to the column address includes nine ENOR circuits 45c (a single-bit agreement detector), and an NAND gate 45d (all-bit agreement detector) having nine inputs, which receives outputs of the ENOR circuits 45c and outputs a comparison result signal CCOMP. That is, the address comparator 44b operates as an EOR circuit, and where the 9-bit held write address WRAD is equal to the 9-bit internal address signal IAD2 in all the bits, a low-leveled comparison result signal CCOMP is outputted. Since the NAND gates 45b and 45d are provided in accordance to the row address and the column address respectively, the number of the transistors connected in parallel in the NAND gates 45b and 45d can be lessened. As a result of this, the comparison result signals RCOMP and CCOMP can be outputted at a high rate.

The decision circuit 44c is composed of an NOR circuit (an AND gate of negative logic). The decision circuit 44c outputs a high-leveled agreement signal AGR where both comparison result signals RCOMP and CCOMP are at a low level. That is, the agreement signal AGR is activated where both the row address and column address are made coincident.

Figure 6:
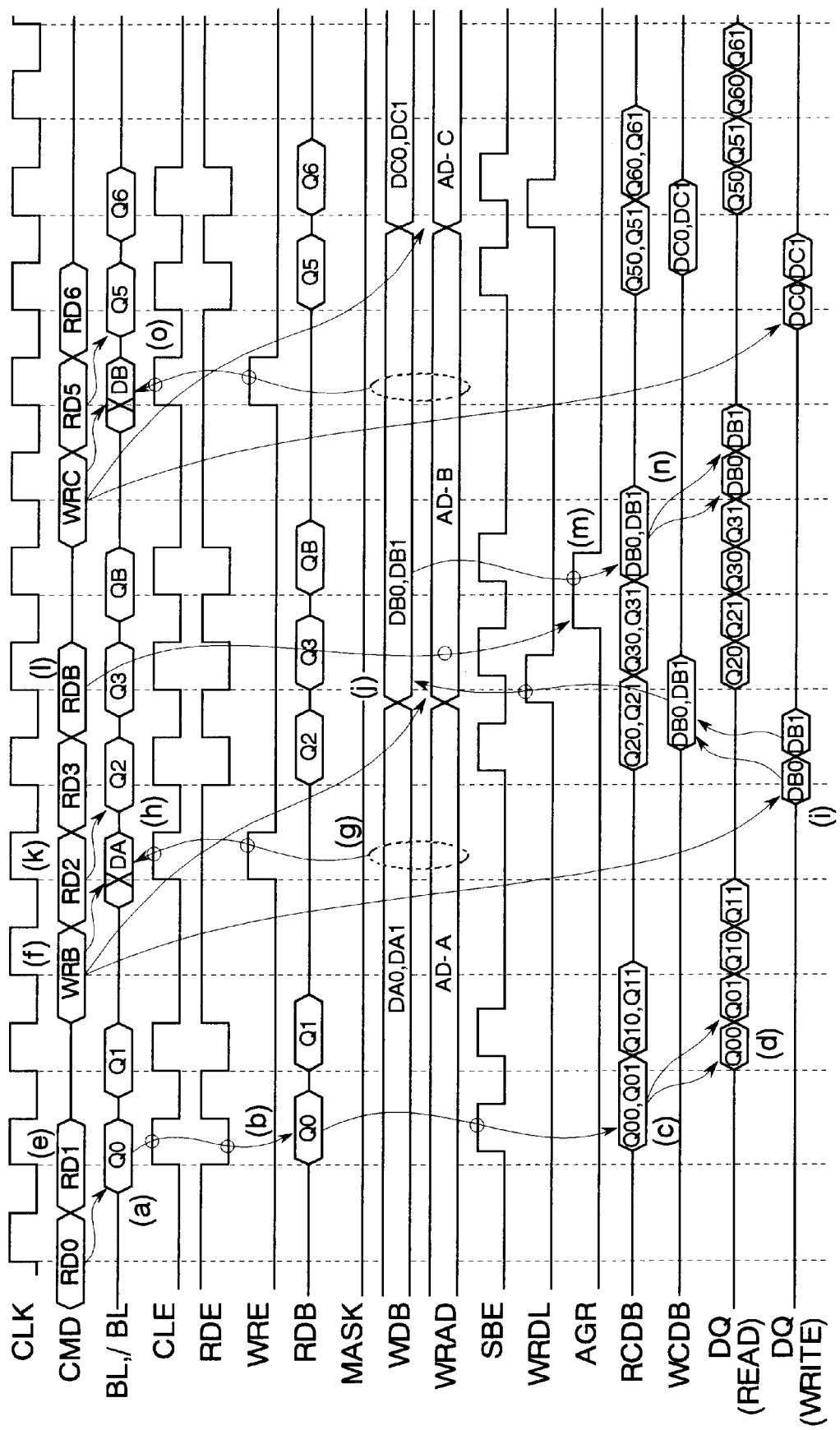
FIG. 6 is a timing chart showing operations of an SDRAM according to the first embodiment.

FIG. 6 shows an example of performing a write operation during the read operations in the above-described SDRAM. In this example, both the read latency and write latency are set to "2".

First, a read command RD0 is provided, the memory core unit 6 is operated, and read data Q0 and Q1 are outputted to the bit lines BL and /BL (FIG. 6(a)). Also, the letter or number at the end of the command signal CMD indicates an address. Next, the column enable signal CLE and the read enable signal RDE are activated, and the data on the bit lines BL and /BL are outputted as a read data signal RDB (Q0) (FIG. 6(b)). After that, the sense buffer enable signal SBE is activated, and the data read from the memory cells MC are transmitted as read data signals RCDB(Q00 and Q01) (FIG. 6(c)). The read data signals RCDB are series-converted, and are outputted as data signals DQ sequentially (FIG. 6(d)).

As in the above description, a next read command RD1 is provided, and a read operation is performed (FIG. 6(e)).

A write command is provided two clocks later from the acceptance of the read command RD1 (FIG. 6(f)). At this time, the write amplifier 46 holds previous write data DA0 and DA1, and the address register 38 holds a previous write address AD-A (FIG. 6(g)). The control circuit 28 inactivates the data invalid signal DINV, and transmits, to the write amplifier 46, that the write amplifier 46 and address register 38 hold valid data. In addition, the column enable signal CLE and write enable signal WRE are activated, and the previous write data DA0 and DA1, which are held by the write amplifier 46, are written in the memory cells MC corresponding to the previous write address AD-A (FIG. 6(h)).

Write data DB0 and DB1 corresponding to the write command WRB are provided two clocks later from the acceptance of the command (FIG. 6(i)). The write data DB0 and DB1 that are thus provided are taken in the write amplifier 46 in synchronization with the write data latch signal WRDL after they are parallel-converted. A write address AD-B delayed by the delay circuit 36 is taken in the address register in synchronization with the activation of the register control signal REG (not illustrated) (FIG. 6(j)).

Next, read command RD2 and RD3 are provided, and a read operation is performed (FIG. 6(k)).

Further, a read command RDB is provided (FIG. 6(l)). The read command RDB has an address that is the same as that of the previous write command WRB. The address signal (IAD2) supplied along with the read command RDB is the same as the address signal (IWAD) that is held by the address register 38. Therefore, the address comparison part 44 activates the agreement signal AGR (FIG. 6(m)). The data selecting part 50 receives a high-leveled agreement signal AGR, and outputs the write data (DB0 and DB1), which are held by the write amplifier 46, as read data RCDB (FIG. 6(n)). That is, where a read operation corresponding to the address for which the write operation is not performed in the chip, is performed, not the data that are held in the memory cells MC but the data that are held in the write amplifier 46 are read.

After that, as described above, a write command WRC is provided and the write data (DB0 and DB1) that are held in the write amplifier 46 are written in the memory cells MC (FIG. 6(o)). Further, write data DC0 and DC1 corresponding to the write command WRC are provided, and read commands RD5 and RD6 are provided sequentially.

As described above, in the semiconductor integrated circuit according to the invention, the row address and the column address in the read address and the write address held in the address register 38 are separately compared. Therefore, the circuit configuration of the address comparators 44a and 44b can be reduced, so that address comparison can be performed at a high rate. Resultantly, a read operation can be performed at a high rate in an SDRAM having a delayed write function.

Figure 7:
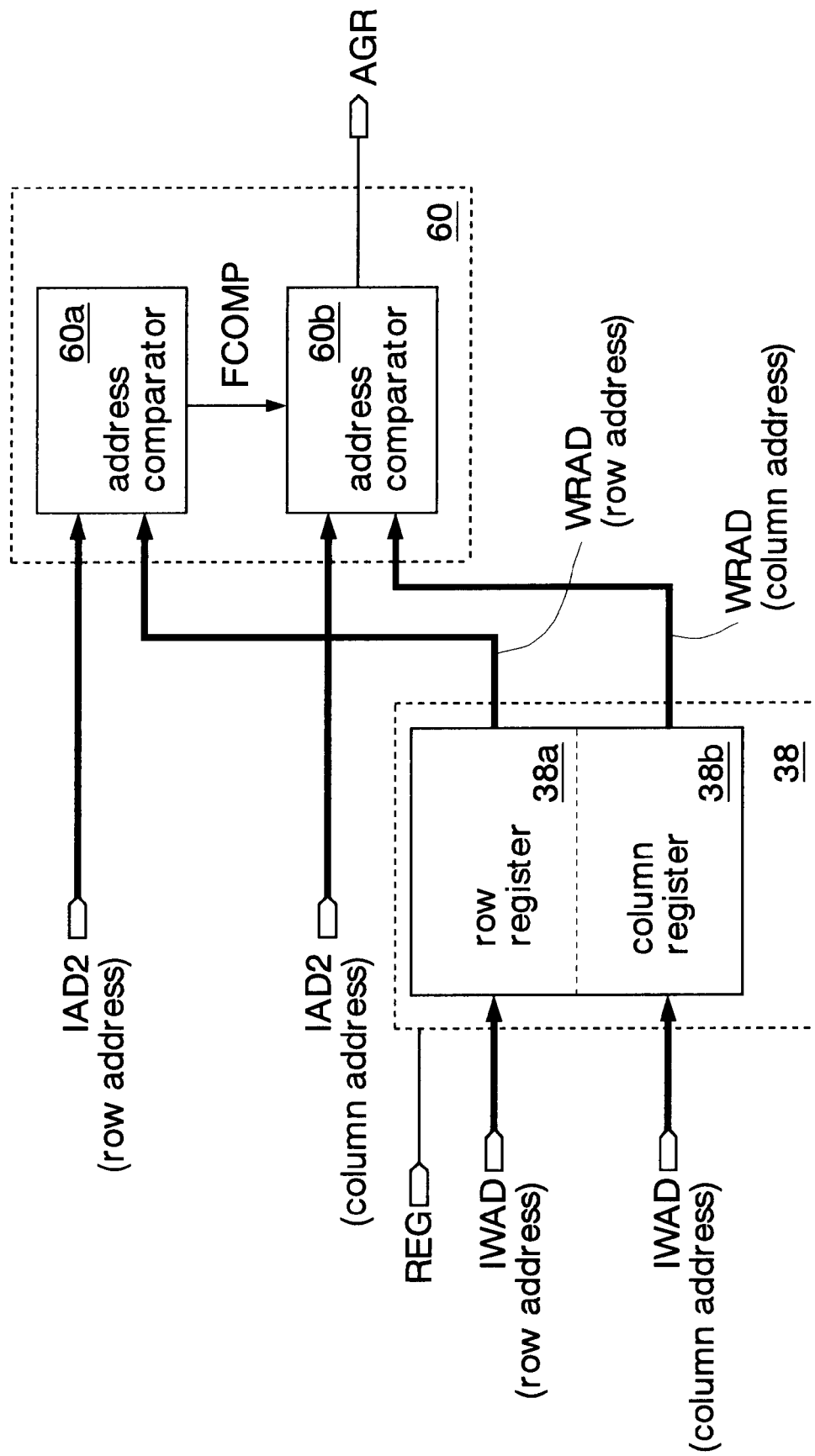
FIG. 7 is a block diagram showing the major parts of a second embodiment of the semiconductor integrated circuit according to the invention.

FIG. 7 shows the second embodiment of a semiconductor integrated circuit according to the invention. Circuits and signals that are identical to those described in the first embodiment are given the same reference symbols, and detailed description thereof is omitted.

The SDRAM according to the embodiment employs the address multiplexing system. Therefore, parts of the address terminals that receive a row address and a column address are commonly used, wherein address signals AD are supplied in the order of the row address and column address. Also, in the SDRAM, the address comparison part 60 differs from that of the first embodiment, and all the other constructions are nearly identical to those of the first embodiment, except for circuits that are related to addresses.

The address comparison part 60 includes two address comparators 60a and 60b. The address comparator 60a is formed of an EOR circuit, etc. The address comparator 60b is formed of an EOR circuit that is controlled by a comparison result signal FCOMP.

Figure 8:
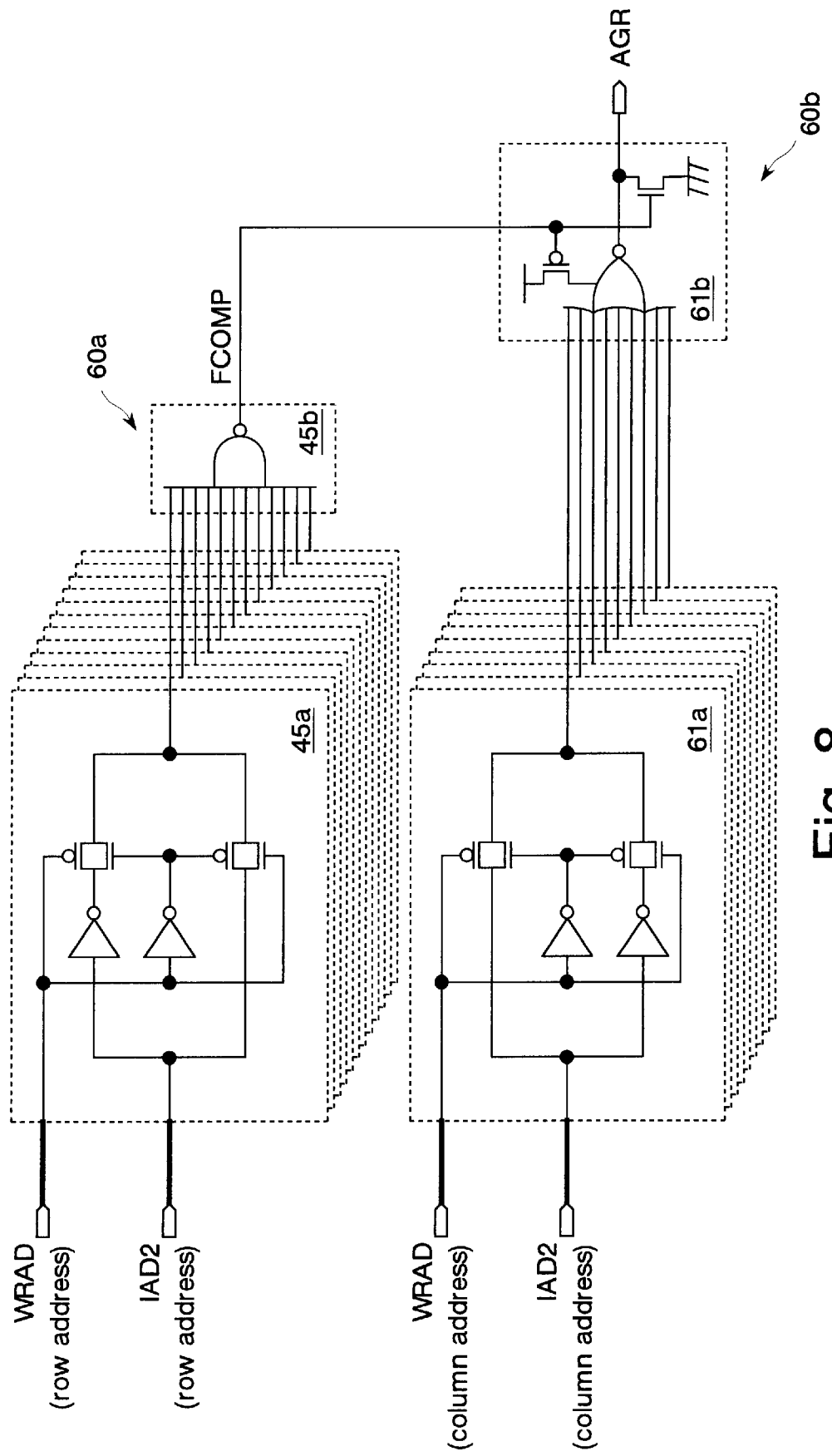
FIG. 8 is a circuit diagram showing the detail of the address comparison part shown in FIG. 7.

FIG. 8 shows the detail of the address comparison part 60.

The address comparator 60a corresponding to the row address is the same as the address comparator 44a shown in FIG. 5. That is, the address comparator 60a compares a row address (12 bits) of the internal address signal IAD2 with the row address (12 bits) that is supplied from the address register 38, wherein a low-leveled comparison result signal FCOMP is outputted where both the addresses are coincident.

The address comparator 60b corresponding to the column address includes nine EOR circuits 61a (a single-bit agreement detector) and an NOR gate 61b (all-bit agreement detector, AND gate of negative logic) having nine inputs, which receives outputs of the EOR circuits 61a and a comparison result signal FCOMP and outputs a agreement signal AGR. The NOR gate 61b is connected to a power supply line via a pMOS transistor. The output node of the NOR gate 61b is connected to a ground line via an nMOS transistor. The pMOS gate and nMOS gate receive a comparison result signal FCOMP. The NOR gate 61b is activated when the comparison result signal FCOMP is at a low level (that is, when the row addresses coincide), and operates as an ENOR circuit. Also, the NOR gate 61b is inactivated when the comparison result signal FCOMP is at a high level (that is, when the row addresses do not coincide), and output a low-leveled agreement signal AGR. That is, the address comparator 60b is activated in response to receiving a low-leveled comparison result signal FCOMP, and outputs a high-leveled agreement signal AGR when a nine-bit column address of the internal address signal IAD2 is equal to the nine-bit column address (WRAD) supplied from the address register 38 in all the bits.

That is, in the embodiment, first, the address comparator 60a operates with respect to the row address that is first supplied, and the address comparator 60b operates with respect to the column address that is supplied next. Since the address comparator 60b does not operate when the address comparator 60a does not activate the comparison result signal FCOMP (that is, FCOMP=high level), the power consumption is decreased.

Further, since the row address is compared before the column address is supplied, the write addresses that are held in the address register 38 and the read address are compared at a high rate. The access time in the read operation is determined by the supplying timing of the row address. Therefore, it is important to compare the row addresses in advance in order to perform the read operation at a high rate.

In the embodiment described above, effects that are similar to those of the above described first embodiment can be brought about. Further, in the embodiment, the power consumption can be reduced, and the read operation can be performed at a still higher rate.

Also, in the above-described first embodiment, a description was given of the example in which the invention is applied to an SDRAM in which a row address and a column address are supplied at the same time. The invention is not limited to such an embodiment. For example, the invention may be applicable to an SDRAM of the address multiplexing system in which a row address and a column address are supplied by using the same address terminal.

In the above-described first embodiment, a description was given of the example in which a row address and a column address are compared by two address comparators 44a and 44b. The invention is not limited to such an embodiment. If the addresses have plenty of bits, the row address and the column address are further separated, and may be compared by four or more address comparators.

In the above-described first embodiment, a description was given of the example in which both the read latency and write latency are set to "2". The latency may be set to a number other than "2", and the read latency and the write latency may be set to different numbers.

In the above-described first embodiment, a description was given of the example in which the invention is applied to a DDR SDRAM. However, for example, the invention may be applicable to an SDR SDRAM (Single Data Rate SDRAM) in which data are inputted and outputted in synchronization with the rise edge of a clock signal.

In the above-described second embodiment, a description was given of the example in which a NOR gate 61b of the address comparator 60b is activated or inactivated in response to the comparison result signal FCOMP. The invention is not limited to such an embodiment. For example, the EOR circuit 61a of the address comparator 60b may be activated or inactivated in response to a comparison result signal FCOMP.

In the above-described embodiments, a description was given of the example in which the invention is applied to a SDRAM. However, the invention is not limited to such embodiments. For example, the invention may be employed in other memory LSIs such as FCRAM (Fast Cycle RAM) or may be applicable to system LSIs having a DRAM memory core implemented therein. Also, various modifications may be made without departing from the spirit and scope of the invention. Any improvement may be made in part or all of the components.

What is claimed is:

1. A semiconductor integrated circuit comprising:
   a memory cell;
   an address holding part for holding a write address which is supplied corresponding to a write command, as a held write address;
   a data holding part for holding write data provided corresponding to said write command as held write data, and for writing said held write data to said memory cell corresponding to said held write address upon receiving a next write command;
   an address comparison part including a plurality of address comparators that compare a read address supplied corresponding to a read command with said held write address, by a plurality of bits; and
   a data selecting part for outputting one of said held write data and read data from said memory cell, according to the result of comparison by said address comparison part.

2. The semiconductor integrated circuit according to claim 1, wherein said address comparison part includes said address comparators corresponding to each of a row address and a column address.

3. The semiconductor integrated circuit according to claim 1, wherein one of said address comparators operates in response to when comparison by another address comparator results in a coincidence.

4. The semiconductor integrated circuit according to claim 3, wherein:

said address comparators correspond to each of a row address and a column address;

parts of said row address and said column address are sequentially supplied through a same address terminal; and said address comparator corresponding to said column address operates according to a result of comparison by said address comparator corresponding to said row address.

* * * * *